United States Patent
Diewald et al.

(10) Patent No.: US 6,764,954 B2
(45) Date of Patent: Jul. 20, 2004

(54) APPLICATION OF ALIGNMENT MARKS TO WAFER

(75) Inventors: Wolfgang Diewald, Villach (AT); Klaus Mümmler, Erlangen (DE)

(73) Assignee: Infineon Technologies AG, Munich (*) Notice: Subject to any disclaimer, the term of this patent is extended or adjusted under 35 U.S.C. 154(b) by 0 days.

(21) Appl. No.: 10/333,453

(22) PCT Filed: Jul. 6, 2001

(86) PCT No.: PCT/EP01/07782
§ 371 (c)(1),
(2), (4) Date: Jan. 21, 2003

(87) PCT Pub. No.: WO02/09176
PCT Pub. Date: Jan. 31, 2002

(65) Prior Publication Data
US 2003/0157779 A1 Aug. 21, 2003

(30) Foreign Application Priority Data
Jul. 26, 2000 (DE) .......................... 100 37 446

(51) Int. Cl.[7] .......................................... H01L 23/544
(52) U.S. Cl. ........................ 438/692; 438/700; 257/797
(58) Field of Search .................................. 438/692, 700

(56) References Cited

U.S. PATENT DOCUMENTS

| | | | |
|---|---|---|---|
| 5,786,260 A | 7/1998 | Jang et al. | |
| 5,858,854 A | 1/1999 | Tsai et al. | |
| 5,874,778 A | 2/1999 | Bhattacharyya et al. | |
| 5,904,563 A | 5/1999 | Yu | |
| 6,020,263 A | 2/2000 | Shih et al. | |
| 6,051,496 A | 4/2000 | Jang | |
| 6,080,636 A | 6/2000 | Tseng | |
| 6,486,049 B2 * | 11/2002 | Maltabes et al. | ........... 438/597 |

FOREIGN PATENT DOCUMENTS

| | | |
|---|---|---|
| JP | 2000232154 | 8/2000 |
| WO | WO 00/35627 | 6/2000 |

OTHER PUBLICATIONS

Gotkis, Y. et al., "Cu CMP with orbital technology. Summary of the Experience.", *Advanced Semiconductor Manufacturing Conference IEEE/SEMI*, pp. 364–371, 1998; XP 010314156.

Moussavi, M. et al., "Comparison of Barrier Materials and Deposition Processes for Copper Integration", *Interconnect Technology Conference, IEEE*, pp. 295–297, 1998; XP010295546.

* cited by examiner

Primary Examiner—W. David Coleman
(74) Attorney, Agent, or Firm—Fish & Richardson P.C.

(57) ABSTRACT

The invention relates to a method for applying adjusting marks on a semiconductor disk. A small part structure consisting a non-metal is produced in an extensive metal layer and the semiconductor disk is subsequently planed in said region with the help of chemical and mechanical polishing. The structural sizes in the metal layer and the chemical-mechanical polishing process are adjusted to each other, in such a way that the small part non-metal structure protrudes above the extensive metal layer after polishing.

14 Claims, 2 Drawing Sheets

APPLICATION OF ALIGNMENT MARKS TO WAFER

FIELD OF INVENTION

The invention relates to a method of applying alignment marks to a semiconductor wafer.

BACKGROUND

U.S. Pat. No. 5,786,260 discloses a method of applying alignment marks to a semiconductor wafer in which depressions are formed in a surface region of the semiconductor wafer, lands being formed between the depressions, an intermediate layer then being applied and then an insulating layer or else a metal layer. During a subsequent CMP process, the insulating layer or the metal layer is removed, by using the dishing behavior, in such a way that the edges of the alignment marks are exposed and stand out. A subsequent etching step for the remaining removal of the insulating layer or metal layer in the depressions is specified as optional.

U.S. Pat. No. 6,051,496 discloses the use of a stop layer during the CMP process, said layer being deposited on a dielectric layer having lands and depressions, specifically in particular in the case of a CU damascene.

U.S. Pat. No. 6,080,636 discloses a production process for a photolithographic alignment mark by means of a CMP process.

U.S. Pat. No. 6,020,263 discloses a method of exposing alignment marks following a CMP process on tungsten metal.

The structuring of semiconductor wafers in order to produce microelectric components is carried out almost entirely nowadays with the aid of lithographic techniques. In this case, the structures are initially produced via a photo mask in a thin radiation-sensitive resist layer, normally an organic photoresist layer, which is applied to the semiconductor wafer. By means of a suitable developer, the irradiated or unirradiated regions are then removed. The resist pattern produced in this way is used as a mask for a subsequent process step, for example etching or ion implantation, with which the pattern is transferred into the semiconductor structure layer lying underneath. The resist mask is then dissolved away again.

In this case, for the quality of the lithographic method it is critical to transfer the resist structure in correct position to the semiconductor layer lying underneath. In this case, it is in particular necessary to align the exposure device accurately in relation to the semiconductor wafer in order to form the mask structure. In order to align the exposure device, therefore, alignment marks are generally applied to the semiconductor wafer. These alignment marks are generally a structure comprising bars and lines which, in general, are executed in the kerf region of the semiconductor wafer. The kerf region of the semiconductor wafer represents a region about 50 to 100 $\mu$m wide between the individual chips on the semiconductor wafer which, when the semiconductor wafer is subsequently broken up into the individual chips, is then destroyed. However, the alignment operation is difficult when an additional, optically non transparent layer is applied, which is needed for example for the production of a capacitor, and therefore the alignment mark structure lying underneath in the semiconductor wafer cannot be registered optically. In such a case, the application of the alignment marks to the semiconductor wafer in the prior art is then carried out in such a way that, during the etching of the preceding structure into the semiconductor wafer, at the same time the bars and lines are etched into the kerf area, the alignment masks being designed in such a way that during the following process steps, including the deposition of the optically non transparent layer, said alignment marks are no longer completely filled. The topology of the alignment marks on the semiconductor wafer can then be registered by means of optical alignment mark detection methods and can be used to align the exposure device.

However, this manner of forming the alignment marks proves to be unsuitable in particular when it is intended to be carried out in the context of the damascene technique, which is used substantially for structuring a metallization plane. In the damascene technique, which is primarily used for structuring copper, in order to produce the metal wiring, at the location of the conductor tracks depressions are etched into the oxide lying underneath. In this etching step, the alignment mark structure is then also formed in accordance with the conventional method. There then follows the sputtering on or deposition of a thin start layer to form a nucleus for the subsequent metal deposition over the entire area. By means of chemical-mechanical polishing of the metal layer down as far as the surface of the etched trenches, the desired conductor tracks are then produced. Since, in the damascene method, substantially perfect planarization of the metal layer is carried out, the topology of the alignment marks is also largely leveled during the chemical-mechanical polishing, so that said alignment marks no longer stand out following the application of a following, optically non transparent layer. Furthermore, in particular in the copper damascene method, the trenches etched for the alignment marks also cannot be formed in such a way that these are not filled up completely during the copper deposition, since copper always begins to fill all the trenches from the bottom up, irrespective of their width, during the deposition methods which are normally used, and it is therefore not possible either to produce any voids, that is to say cavities, in the trenches, which then lead to a topology of the alignment marks on an optically non transparent layer that is subsequently deposited.

SUMMARY

In order to solve this problem, therefore, also in the prior art, in particular in the damascene method, a topology of the alignment marks is produced by means of a further lithographic and etching step, which itself requires only inaccurate alignment. For this purpose, following the production of the alignment marks, and the subsequent deposition of the optically non transparent layer, the alignment mark structure is transferred via a dedicated photo mask to a thin radiation-sensitive layer which is applied to the optically non transparent layer. The alignment marks are then exposed by a subsequent etching step. However, this additional lithographic and etching step is complicated and expensive.

It is therefore an object of the present invention to provide a simple and cost-effective method of applying alignment marks to a semiconductor wafer which may be used in particular in conjunction with structuring of the semiconductor wafer with the aid of the damascene technique.

According to the invention, to apply alignment marks, an intricate structure consisting of a non metal is produced in a large-area metal layer on at least one area of a semiconductor wafer. This area of the semiconductor wafer having the large-area metal layer is then planarized by means of chemical-mechanical polishing, the non metal structure in the metal layer and the chemical-mechanical polishing process being coordinated with each other in such a way that the non metal structure stands out from the large-area metal layer.

Forming the alignment marks in accordance with the invention follows the model of the damascene technique, but as opposed to the conventional alignment mark design, a structure consisting of a non metal is produced in a large-area metal layer. This design makes it possible to make specific use of two effects generally viewed as negative during planarization with the aid of the chemical-mechanical polishing.

This is because, during chemical-mechanical polishing, large-area metal surfaces, if they are to be leveled, tend to be removed to too great an extent, that is to say tend to a dishing behavior. Then, in the structure according to the invention, this leads to the intricate non metal structure present in the metal layer standing out, so that a topology that can be used as alignment marks is produced on a non transparent layer which is subsequently applied.

Furthermore, in order to make the alignment marks contrasty, use can also be made of the effect that occurs during chemical-mechanical polishing, that intricate non metal structures in a large-area metal layer, if the latter is to be planarized, likewise tend to be removed to too great an extent as compared with the surrounding metal layer, that is to say tend to erode, and therefore to form trenches in the metal layer. This trench formation of the alignment marks then ensures a topology on the non transparent layer which is subsequently applied, which is suitable for aligning an exposure device.

Depending on the design of the chemical-mechanical polishing operation and the design of the metal surface and the non metal structure contained therein, it is therefore possible to cause the non metal structure to stand out owing to a dishing behavior of the metal surface or this non metal structure to form trenches in the metal surface owing to an erosion behavior, which is then reflected in a topology on the non transparent layer arranged above it.

According to a preferred embodiment, the application of the alignment mask is carried out in the damascene technique, the large-area metal layer being deposited onto a layer consisting of a dielectric and having large-area depressions. In this case, between the dielectric layer and the metal layer, the further thin intermediate layer is provided in order to form a nucleus for the metal deposition and as a diffusion barrier.

The chemical-mechanical polishing process is carried out in two stages, the metal layer being removed in a first stage and being stopped on the intermediate layer lying underneath. During this first polishing step, dishing takes place in the large metal surfaces between the projecting dielectric structures, the intermediate layer on the projecting dielectric structures also partly being removed. In a second polishing step, the intermediate layer on these projecting dielectric structures is then removed, the polishing operation being stopped in the dielectric. During this second polishing operation, intensive overpolishing of the intermediate layer, and therefore erosion of the dielectric layer lying underneath, take place, so that trenches form between the large-area metal layers and then still remain detectable as alignment marks following the application of a non transparent layer.

This method sequence makes it possible, in particular when copper is used as the metal layer and tantalum/tantalum nitride as the intermediate layer, to use the formation of alignment marks also within the context of copper metallization in order to form conductor tracks.

The invention will be explained in more detail using the appended drawings, in which:

DETAILED DESCRIPTION

Figure 1:
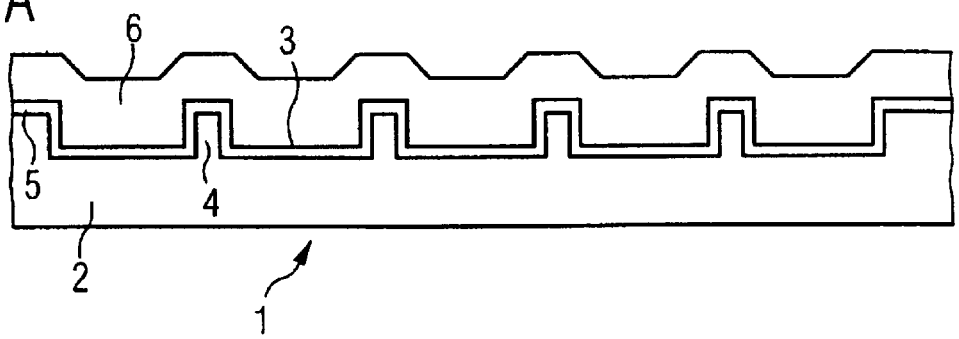
FIG. 1 shows a possible embodiment of the method according to the invention of applying alignment marks in the context of copper metallization with the aid of the damascene method, FIG. 1A showing the layer structure before chemical-mechanical polishing, FIG. 1B after a first polishing step and FIG. 1C after a second polishing step.
Figure 1:
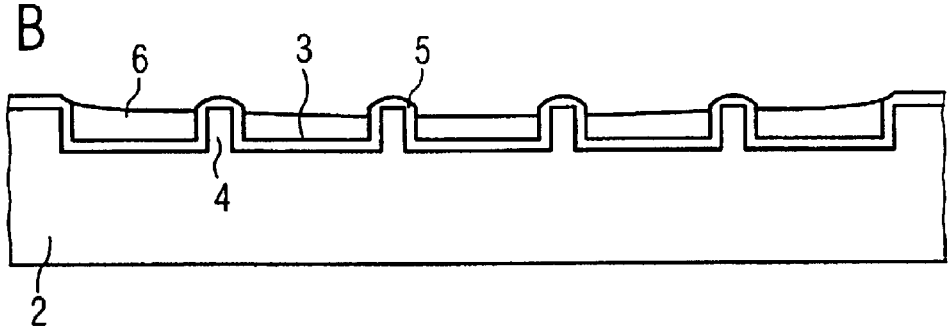
Figure 1:
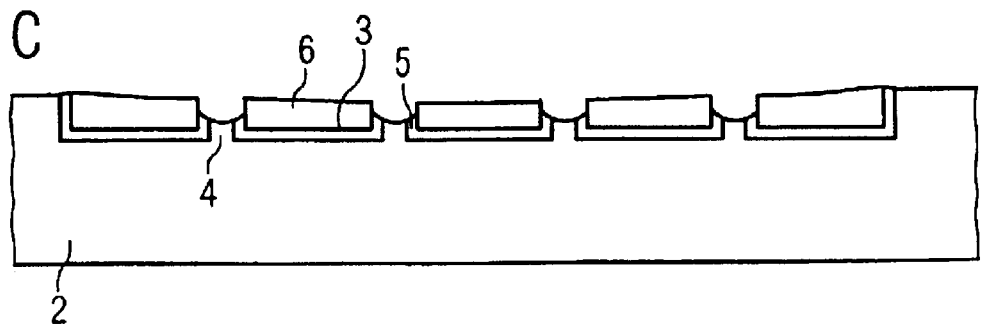

Integrated circuits are generally produced on the semiconductor wafers with the aid of lithographic methods. In this case, each structural level is first produced via a photo mask in a thin radiation-sensitive layer deposited onto the semiconductor wafer, generally an organic resist layer, and then transferred into the semiconductor layer lying underneath in a special etching method. In this case, care must be taken that the structures lying one above another and belonging to the integrated circuits are arranged in an accurate position in relation to one another, in order to achieve the highest possible integration density. In this case, for an accurately positioned arrangement it is critical that the exposure device for superimposing the mask structure is aligned exactly with a structure already present on the semiconductor wafer.

In order to align the exposure device, alignment marks are applied to the semiconductor wafer, preferably in a kerf area 1 which is 50 to 100 $\mu$m wide and which is subsequently used to break up the semiconductor wafers into the individual chips. Here, the alignment marks have to be designed in such a way that they produce a topology in the layer applied to the alignment marks which may then be registered optically.

In the following text, the production according to the invention of such alignment marks will be presented within the context of copper structuring, which is carried out in the damascene technique.

In order to produce the copper wiring in the damascene technique, at the location of the conductor tracks depressions are etched as anisotropically as possible into a dielectric layer 2 which is applied to the semiconductor wafer and preferably consists of silicon oxide. At the same time as this etching of the depressions for the conductor tracks, further large-area depressions 3 are etched into the dielectric layer 2, preferably in the kerf area 1 of the semiconductor wafer, narrow lands 4 remaining in the dielectric layer between these additional large-area depressions 3, as shown in FIG. 1A.

In the area of the conductor tracks, in the damascene method, an intermediate layer is then applied, preferably either by means of sputtering on or CVD deposition. This intermediate layer ensures, firstly, reliable separation of the copper from the dielectric and from the semiconductor substrate lying underneath. In this case, the material preferably used for the intermediate layer is an tantalum/tantalum nitride double layer. As shown in FIG. 1A, this intermediate layer 5 is also applied in the area of the additional depressions 3 in the dielectric layer 2, which are implemented in the kerf area 1 of the semiconductor wafer. Then, copper in a thickness of about 1 µm is deposited over the entire semiconductor wafer, that is to say both in the conductor track area and in the kerf area 1, electrolytically or chemically in a current-free manner. This then results in an overall structure in the kerf area 1 as shown in FIG. 1A.

Figure 2:
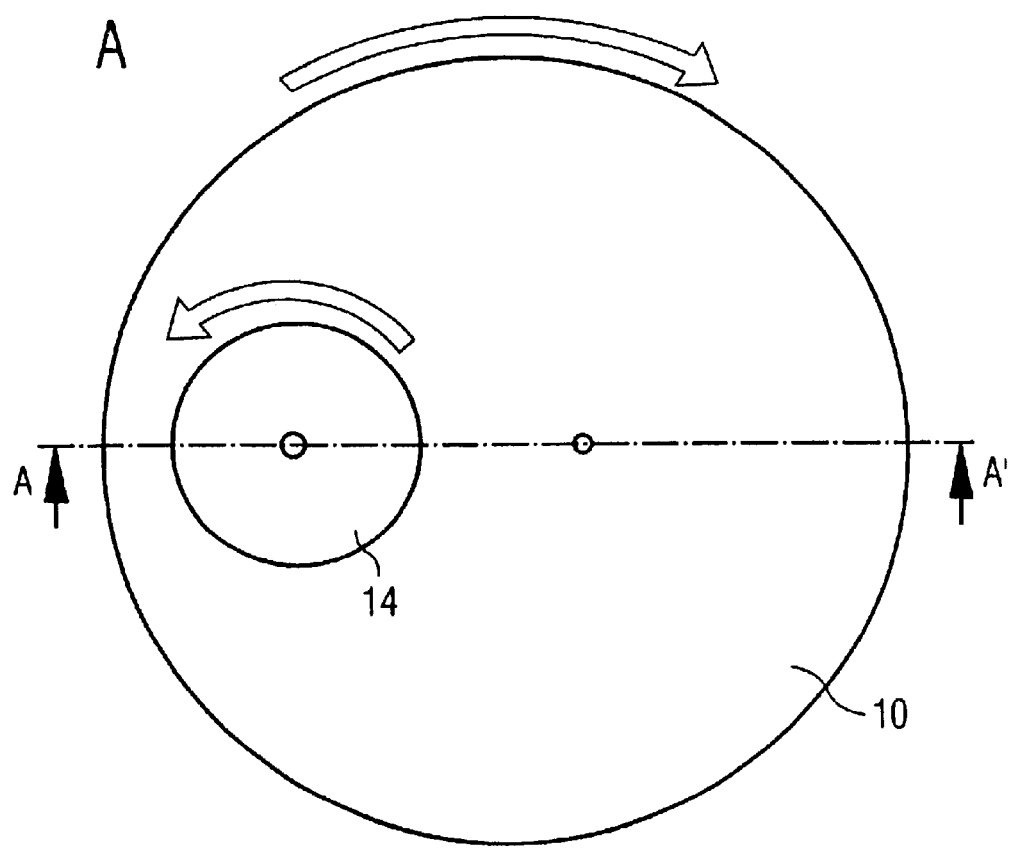
FIG. 2 shows an apparatus for chemical-mechanical polishing, FIG. 2A showing a plan view and FIG. 2B showing a sectional view.
Figure 2:
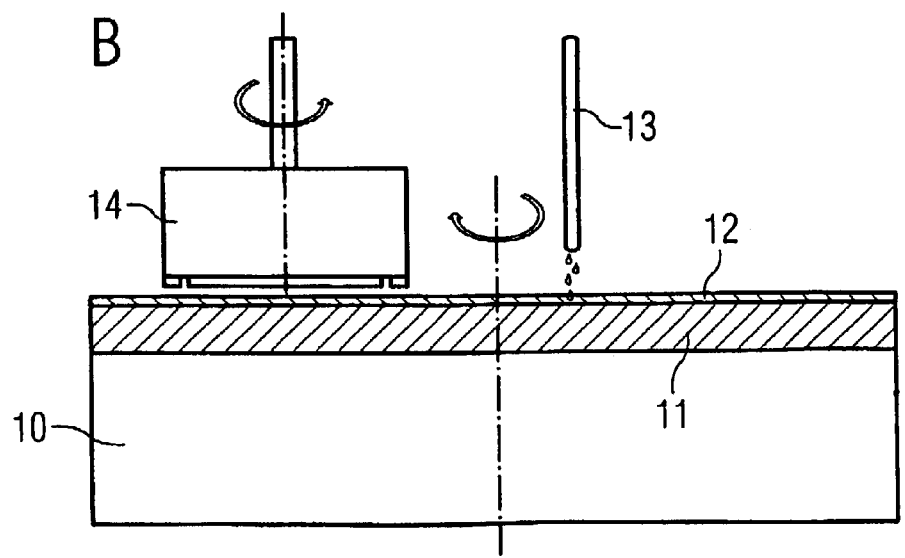

In order to work out the alignment marks, a two-stage chemical-mechanical polishing process is then used. FIG. 2 shows, schematically, an apparatus for chemical-mechanical polishing, a plan view being illustrated in FIG. 2A and a section along the A line in FIG. 2B. On a rotatably arranged polishing table 10 there is arranged a resilient, perforated pad 11 which contains a polishing agent 12. The polishing agent 12 is supplied to the pad 11 via a polishing-agent feed 13. For the purpose of chemical-mechanical polishing, the semiconductor wafer to be processed is pressed onto the pad 11 on the polishing table 10 by a wafer carrier 14. At the same time, the semiconductor wafer and the polishing table 10 rotate. The polishing agent 12 is composed in such a way that it contains both polishing grains and active chemical additives. The polishing grains, which generally have a diameter of 20 to 50 nm, are used for the mechanical polishing of the surface of the semiconductor wafer. The chemical additives in the polishing agent 12 are matched to the layer material to be removed.

In the chemical-mechanical polishing process illustrated in FIG. 1 for working out the alignment mark structure, the copper layer 6 is removed in a first polishing process, being stopped on the intermediate layer 5 consisting of tantalum/tantalum nitride. The copper polishing process is in this case carried out with a polishing agent based on aluminum oxide. Pan W (Freudenberg) is preferably used as polishing table pad. This first copper polishing step on the kerf area 1 is preferably carried out at the same time as the copper layer is polished away over the depressions provided for the conductor tracks.

As FIG. 1B shows, during the copper polishing in the kerf area 1, a dishing behavior of the copper areas occurs so that the lands 4 in the dielectric layer 2 stand out from the metal surface 6. However, at the same time as the dishing of the copper during the polishing process, there is also partial removal of the intermediate layer 5 in the area of the lands 4 in the dielectric layer 2, as FIG. 1B further shows.

After the copper polishing step, a second tantalum polishing step is carried out, in which the intermediate layer 5 on the lands 4 in the dielectric layer 2 is removed. In this case, a polishing agent based on colloidal silicon oxide is preferably used for the tantalum polishing. Embossed Politex (Rodel) is preferably used as the polishing table pad. In this tantalum polishing step, as FIG. 1C shows, very intensive removal of the intermediate layer 5 in the area of the lands 4 takes place, in which material is also removed from the dielectric layer 2 lying underneath. This overpolishing, which leads to erosion of the dielectric layer 2 lying under the intermediate layer, can also be attributed in particular to the fact that a large part of the intermediate layer 5 has already been removed in the copper polishing step. As a result of the tantalum polishing step, as FIG. 1C shows, the formation of trenches in the area of the lands 4 in the dielectric layer 2 occurs between the metal surfaces 6. This trench formation then ensures that a topology of the alignment marks, which is suitable for aligning an exposure device for transferring a mask, then becomes apparent on a layer that is subsequently applied.

The method according to the invention of forming the alignment marks is substantially based on the model of the damascene technique, but with an intricate structure consisting of a non metal being produced in a large-area metal layer. This layer structure makes it possible, with the aid of the chemical-mechanical polishing and by using the intrinsically negative effects of the dishing of large metal surfaces or the erosion of intricate structures during the polishing operation, to work the intricate structure out of the large metal surface.

In the embodiment presented above, a two-stage polishing process is used, which is suitable in particular for forming alignment marks in a copper metallization plane. The two-stage polishing process presented, in which the copper metal layer 6 is polished away first and then the intermediate layer 5, can, however, also be replaced by a single-stage polishing process in which only copper polishing is carried out. As a result of this single polishing process, as shown in FIG. 1B, the lands 4 of the dielectric layer 2 then stand out between the metal surfaces, and said layer is then also revealed as a topology on a non transparent layer deposited thereon. Instead of the use of copper as metal and an intermediate layer of tantalum/tantalum nitride, however, there is also the possibility of using another metal or another material for the intermediate layer.

The features of the invention disclosed in the above description, the drawings and the claims can be important, both individually and in any desired combination, to implement the invention in its various configurations.

What is claimed is:

1. A method of applying alignment marks to a semiconductor wafer, the method comprising:

producing a non-metal intricate structure in a large-area metal layer in at least one area of the semiconductor wafer by forming depressions in a surface area of the semiconductor wafer, lands being formed between the depressions, and subsequent deposition of the metal layer over the entire surface area; and planarizing the area of the semiconductor wafer having the large-area metal layer by means of chemical-mechanical polishing, so that the non-metal intricate structure stands out from the large-area metal layer after the polishing process;

an additional intermediate layer being applied between the semiconductor surface and the metal layer;

the planarization being carried out in two stages by means of chemical-mechanical polishing, in the first stage the metal layer being removed and being stopped on the intermediate layer lying underneath and, in the second stage, the intermediate layer being removed and stopped in the lands lying underneath; and the first stage being designed in such a way that overpolishing of the metal surfaces between the projecting lands is carried out, the intermediate layer on the projecting lands also being partly removed at the same time, and the second stage being designed in such a way that intensive overpolishing of the intermediate layer is carried out, in which erosion of the lands lying underneath takes place, so that trenches result between the metal surfaces.

2. The method according to claim 1, in which the chemical-mechanical polishing process is carried out in such a way that the large-area metal layer is removed more intensely than the non-metal intricate structure provided therein, so that the intricate structure stands out from the metal layer.

3. The method according to claim 1, in which the chemical-mechanical polishing process is carried out in such a way that the non-metal intricate structure is removed more intensely than the large-area metal layer surrounding it, so that a formation of trenches of the intricate structure occurs in the metal surface.

4. The method according to claim 1 further comprising forming, on the semiconductor surface, a dielectric layer, in which the depressions and lands are executed.

5. The method according to claim 1, wherein the metal layer includes copper.

6. The method according to claim 1, wherein the intermediate layer comprises a tantalum/tantalum nitride double layer.

7. The method according to claim 1, further comprising applying the alignment marks in a kerf area of the semiconductor wafer.

8. A method of applying an alignment mark to a semiconductor wafer, the method comprising:

providing a semiconductor wafer the wafer having walls defining first and second depressions, the first and second depressions defining a land therebetween, the intermediate layer being coated with a metal layer having a depth sufficient to cover the land;

executing a first chemical-mechanical polishing step to remove a sufficient depth of the metal layer to expose the land and to partially erode a portion of the intermediate layer in contact therewith; and executing a second chemical-mechanical polishing step to intensively overpolish the intermediate layer from the exposed land and to erode a portion thereof, thereby forming, on an exposed surface of the land, an alignment mark.

9. The method of claim 8, wherein executing a first polishing step comprises eroding the metal layer more rapidly than the land, thereby causing the land to protrude from the metal layer.

10. The method of claim 8, wherein executing a second polishing step comprises eroding the land more rapidly than the metal layer thereby forming a trench in the land.

11. The method of claim 8, wherein providing a semiconductor wafer comprises providing a wafer coated with a dielectric layer, the intermediate layer being in contact with the dielectric layer.

12. The method of claim 8, wherein providing a semiconductor wafer comprises selecting the metal layer to include copper.

13. The method of claim 8, wherein providing a semiconductor wafer comprises selecting the intermediate layer to be a tantalum/tantalum nitride double layer.

14. The method of claim 8, wherein providing a semiconductor wafer comprises providing a wafer having a kerf area, the method further comprising causing the alignment mark to be formed in the kerf area.

* * * * *